(12) United States Patent
Hyuk

(10) Patent No.: US 7,645,652 B2
(45) Date of Patent: Jan. 12, 2010

(54) CMOS IMAGE SENSOR AND METHOD FOR FABRICATING THE SAME

(75) Inventor: Lim Keun Hyuk, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/507,346

(22) Filed: Aug. 21, 2006

(65) Prior Publication Data

US 2007/0051990 A1    Mar. 8, 2007

(30) Foreign Application Priority Data

Aug. 22, 2005    (KR)    ............ 10-2005-0076800

(51) Int. Cl.
*H01L 21/00* (2006.01)
*H01L 21/338* (2006.01)
*H01L 21/331* (2006.01)

(52) U.S. Cl. ............ 438/181; 438/45; 438/48; 438/185; 438/369; 438/371; 438/372; 438/373; 438/374; 257/E21.001; 257/E21.47

(58) Field of Classification Search .......... 438/174, 438/163; 257/E21.042, E21.135, E21.137, 257/E21.001, E21.47

See application file for complete search history.

(56) References Cited

U.S. PATENT DOCUMENTS 6,329,233 B1 * 12/2001 Pan et al. ............ 438/199

2008/0153193 A1 * 6/2008 Lyu ............ 438/59

FOREIGN PATENT DOCUMENTS

CN    1241037    1/2000
CN    1305229    7/2001

OTHER PUBLICATIONS

Wolf, S.; "Silicon PRocessing for the VLSI Era"; 1995; Lattice Press; pp. 232-246.*
Millman, Jacob and Halkias, Christos C.; "Integrated Electronics: Analog and Digital Circuits and Systems"; 1972; McGraw-Hill, Inc.; pp. 125-126.*

* cited by examiner

*Primary Examiner*—Charles D Garber
*Assistant Examiner*—Mohsen Ahmadi
(74) *Attorney, Agent, or Firm*—Saliwanchik, Lloyd & Saliwanchik

(57) ABSTRACT

A CMOS image sensor and a method of fabricating the same are provided. The CMOS image sensor includes: a semiconductor substrate of a first conductivity type having a photodiode region and a transistor region defined therein; a gate electrode formed above the transistor region of the semiconductor substrate with a gate insulating layer interposed therebetween; a first impurity region formed of the first conductivity type in the semiconductor substrate below the gate electrode and having a higher concentration of first conductivity type ions than the semiconductor substrate; and a second impurity region formed of a second conductivity type in the photodiode region of the semiconductor substrate.

18 Claims, 4 Drawing Sheets

CMOS IMAGE SENSOR AND METHOD FOR FABRICATING THE SAME

RELATED APPLICATION

This application claims the benefit under 35 U.S.C. §119(e), of Korean Patent Application Number 10-2005-0076800 filed Aug. 22, 2005, which is incorporated herein by reference in its entirety.

FIELD OF THE INVENTION

The present invention relates to a complementary metal oxide semiconductor (CMOS) image sensor and a method for fabricating the same.

BACKGROUND OF THE INVENTION

Generally, an image sensor is a semiconductor device that converts an optical image to an electric signal. An image sensor is typically classified into a charge coupled device (CCD) or a complementary metal oxide silicon (CMOS) image sensor.

The CMOS image sensor includes a photodiode and a metal oxide semiconductor (MOS) transistor in a unit pixel, and sequentially detects electrical signals of unit pixels in a switching manner to realize an image.

FIG. 1 is a photograph view of a punch-through of a CMOS image sensor according to the prior art.

In the CMOS image sensor according to the prior art, a wide depletion region is formed due to the low impurity doping concentration of a $N^-$-type diffusion region of a photodiode and the low impurity doping concentration of an epitaxial layer formed on a semiconductor substrate.

FIG. 1 shows a punch-through 'A' occurring. The punch-through 'A' is a phenomenon where a photodiode region 69 contacts a floating diffusion region 72 due to the wide depletion area of the photodiode formed between an $N^-$-type diffusion region of the photodiode 69 and an $N^+$-type floating diffusion region 72, which is the drain region of a transistor 32. When the punch-through 'A' occurs, a dark current increases, which decreases characteristics of the photodiode.

Also, the CMOS image sensor according to the prior art generates noise because of the increase of dark current.

SUMMARY OF THE INVENTION

Accordingly, the present invention is directed to a CMOS image sensor and method for fabricating the same that addresses and/or substantially obviates one or more problems, limitations, and/or disadvantages of the prior art.

An object of the present invention is to provide a CMOS image sensor and a method for fabricating the same, capable of improving characteristics of the image sensor by preventing or reducing dark current.

To achieve these objects and other advantages and in accordance with the purpose of the invention, as embodied and broadly described herein, there is provided a CMOS image sensor including: a semiconductor substrate of a first conductivity type having a photodiode region and a transistor region defined therein; an impurity region of a second conductivity type formed in the photodiode region of the semiconductor substrate; a gate electrode formed on a portion of the transistor region of the semiconductor substrate with a gate insulating layer interposed between the gate electrode and the substrate; and an impurity region of the first conductivity type formed in a portion of the semiconductor substrate that is located below the gate electrode, wherein the impurity region of the first conductivity type has a higher concentration of impurities than that of the semiconductor substrate.

In another aspect of the present invention, there is provided a method for fabricating a CMOS image sensor including: preparing a semiconductor substrate of a first conductivity type having a photodiode region and a transistor region defined therein; forming an impurity region of the first conductivity type in a portion of the transistor region by implanting first conductivity type impurity ions at a higher concentration than that of the semiconductor substrate; forming a gate electrode above the impurity region of the first conductivity type with a gate insulating layer interposed therebetween; and forming an impurity region of the second conductivity type in the photodiode region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a CMOS image sensor and a method for fabricating the same according to an embodiment of the present invention will be described in detail with reference to the accompanying drawings.

FIGS. 2 through 8 are sectional views illustrating a method of fabricating a CMOS image sensor according to an embodiment of the present invention.

Although a P-type semiconductor substrate 161 will be used to describe the methods of fabricating a CMOS image sensor, the present invention is not limited to the P-type semiconductor substrate.

An embodiment according to the present invention will be described for a 4T-type CMOS image sensor having one photodiode and four transistors. However, the present invention can be also applied to other types of CMOS image sensors such as a 3T-type CMOS image sensor having one photodiode and three transistors and a 5T-type CMOS image sensor having one photodiode and five transistors.

The 4T-type CMOS image sensor according to the present invention can have four transistors such as a reset transistor, a transfer transistor, a drive transistor, and a select transistor.

Figure 1:
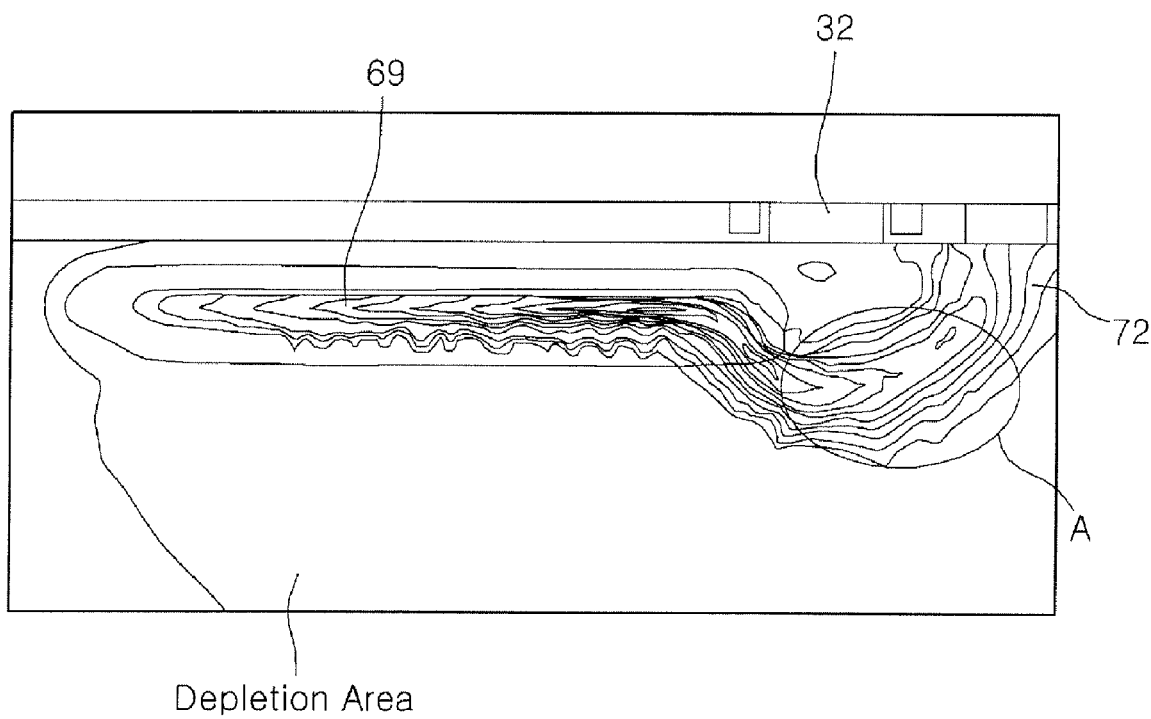
FIG. 1 is a cross-sectional photo showing a punch-through of a CMOS image sensor according to the prior art.
Figure 2:
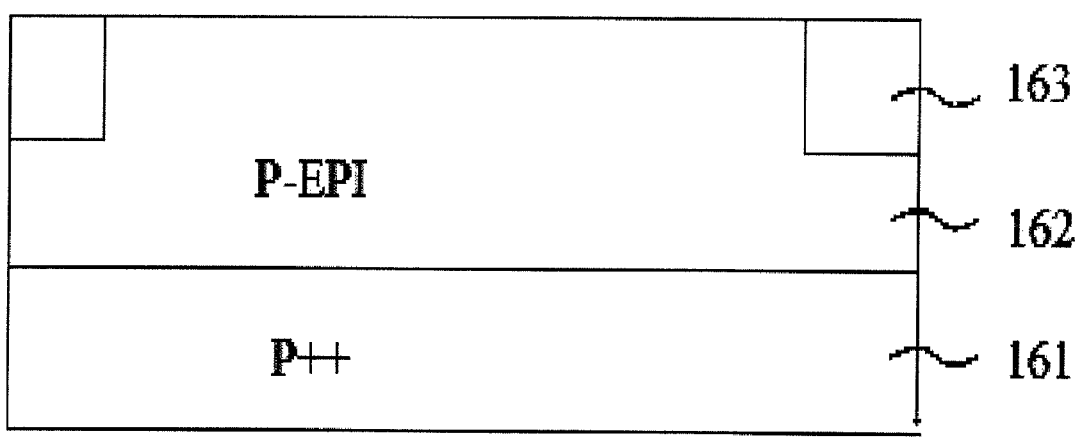
FIGS. 2 through 8 are cross-sectional views showing a method of fabricating a CMOS image sensor according to an embodiment of the present invention.

Referring to FIG. 2, a low concentration $P^-$-type epitaxial layer 162 can be formed by performing an epitaxial process on a high concentration $P^{++}$-type semiconductor substrate 161.

An active region and a device isolation region can be defined in the semiconductor substrate 161. A device isolation layer 163 can be formed in the device isolation region using, for example, a shallow trench isolation (STI) process or a local oxidation of silicon (LOCOS) process.

Figure 3:
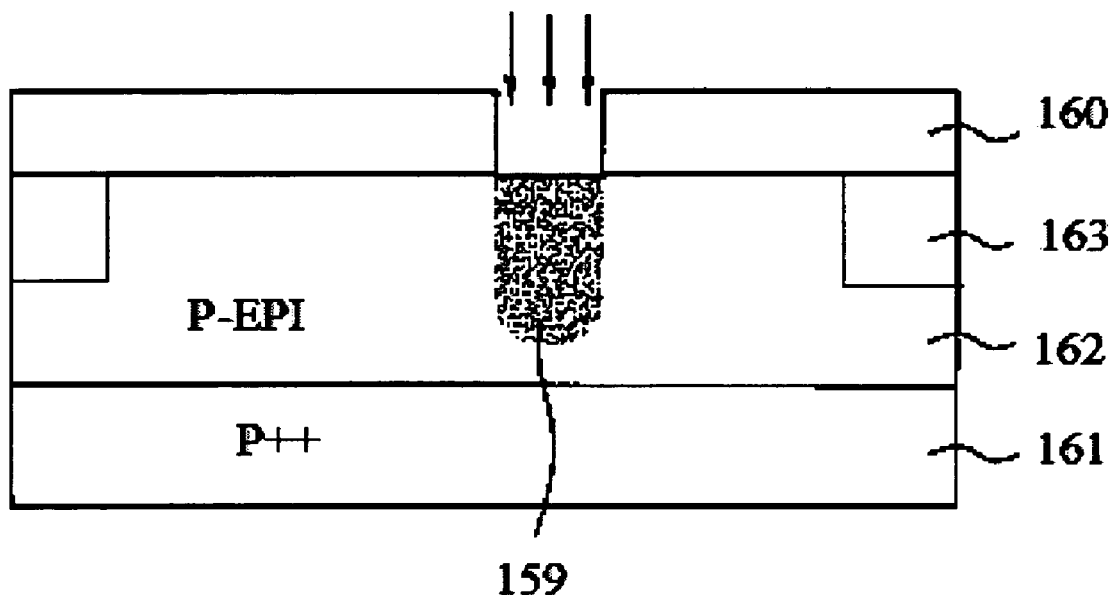

Referring to FIG. 3, a first photoresistive layer 160 can be formed on an entire surface of the P⁻-type epitaxial layer 162 including where the device isolation layer 163 is formed. The first photoresistive layer 160 can be patterned using an exposure process and a development process to cover a photodiode region and source/drain regions and expose a transfer gate electrode region of the transfer transistor.

A P-type impurity region 159 can be formed by implanting P-type impurity ions into the exposed transfer gate electrode region using the patterned first photoresistive layer 160 as a mask. The P-type impurity region has a higher impurity ion concentration than that of the P⁻-type epitaxial layer 162

The P-type impurity region 159 can be formed to a depth that has none or negligible influence on a threshold voltage ($V_{th}$) of the transistor. When the p-type impurity region 159 is adjacent to a gate insulating layer 164, mobility of electrons generated in the photodiode region that move to the transistor region is decreased by increasing the threshold voltage of the transistor.

In one embodiment, the P-type impurity region 159 can be formed to a depth spaced about 0.15 to about 0.3 μm from the gate insulating layer 164.

In another embodiment, the P-type impurity region 159 can be formed by implanting ions using implanting energy of about 100~about 150 KeV.

In a further embodiment, the P-type impurity region 159 can be formed by implanting ions to a depth spaced about 0.15~about 0.3 μm from the gate insulating layer 164 using implanting energy of about 100 to about 150 KeV.

Figure 4:
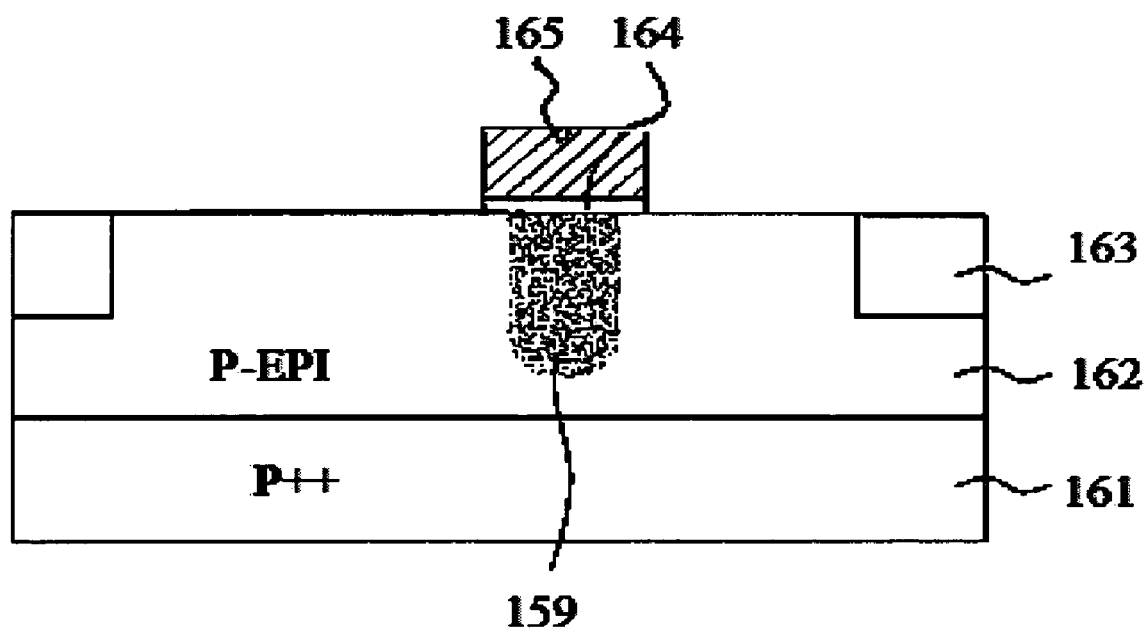

Referring to FIG. 4, after the first photoresistive layer 160 is removed, a gate insulating layer and a conductive layer can be sequentially deposited on the entire surface of the P⁻-type epitaxial layer 162. In a specific embodiment, the conductive layer can be a high concentration poly-crystal silicon layer. Then, the transfer gate electrode 165 can be formed by selectively removing the conductive layer and the gate insulating layer.

The transfer gate electrode 165 can be formed to have a larger width than that of the P-type impurity region 159. When the CD (Critical Dimension) of the P-type impurity region 159 is very large, the number of electrons generated in the photodiode region are decreased due to a narrowed photodiode region. In addition, when the width of the P-type impurity region 159 is very narrow, the P-type impurity region 159 does not properly function as a punch stopper.

Accordingly, in an embodiment for a CD (Critical Dimension) of a transistor of about 0.35 μm, a P-type impurity region 159 having a width less than the CD of the transistor and greater than or equal to about 0.15 μm can serve as a punch stopper.

Figure 5:
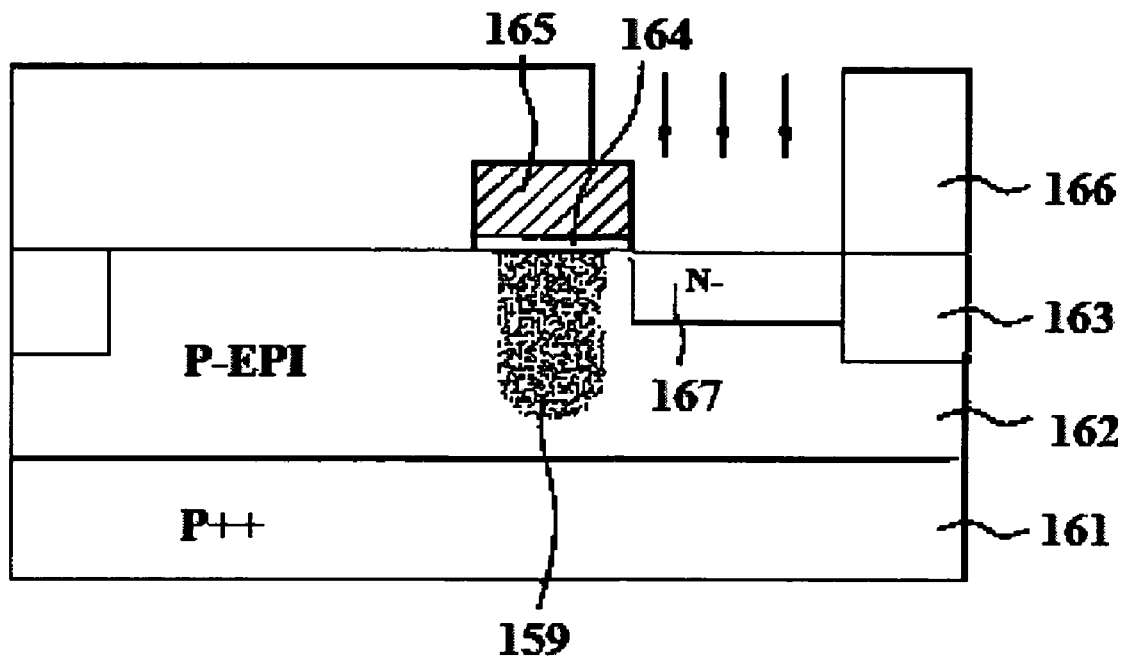

Referring to FIG. 5, a second photoresistive layer 166 can be formed on an entire surface of the semiconductor substrate 161 including the transfer electrode 165, and can be patterned by an exposure process and a development process to cover the photodiode region and expose source/drain regions of the transfer transistor.

A N⁻-type diffusion region 167 can be formed by implanting N-type impurity ions at a low concentration into the exposed source/drain regions using the patterned the second photoresistive layer 166 as a mask. In one embodiment, a portion of the gate electrode 165 can be exposed by the exposure and development processes, and the exposed portion of the gate electrode 165 can also be used as the mask.

Figure 6:
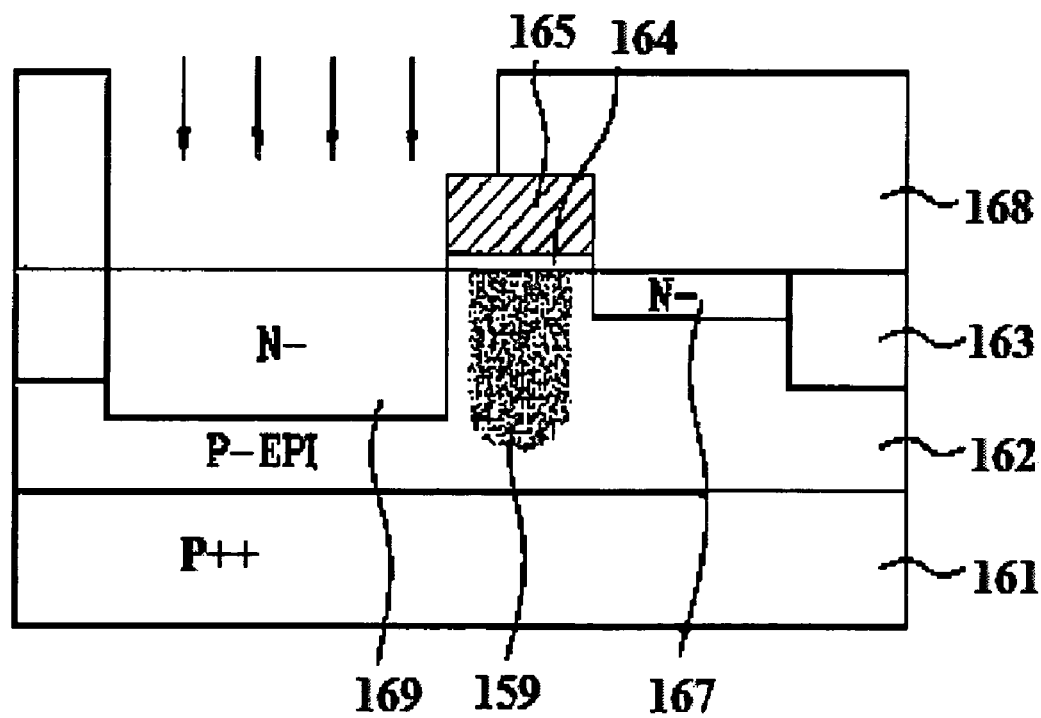

Referring to FIG. 6, after the second photoresistive layer 166 is removed, a third photoresistive layer 168 can be formed on an entire surface of the semiconductor substrate 161, and can be patterned by an exposure process and a development process.

A N⁻-type diffusion region 169 can be formed on the photodiode region by implanting N-type impurity ions into the P⁻-type epitaxial layer 162 using the patterned third photoresistive layer 168 as a mask. The impurity ion implantation for forming the N⁻-type diffusion region 169 can be implanted with a higher ion implantation energy than that of the N⁻-type diffusion region 167 in order to form the N⁻-type diffusion region 169 of the photodiode region more deeply than the N⁻-type diffusion region 167 of the source/drain regions. The N⁻-type diffusion region 169 is deeply formed by the high energy ion implantation energy so as to improve the sensitivity of the image sensor.

The N⁻-type diffusion region 169 formed on the photodiode region can be prevented from a having wide spread of a depletion area by the P-type impurity region 159 formed below the transfer gate electrode 165. Thus, it is preferable that the P-type impurity region 159 is formed deeper than the N⁻-type diffusion region 169.

Figure 7:
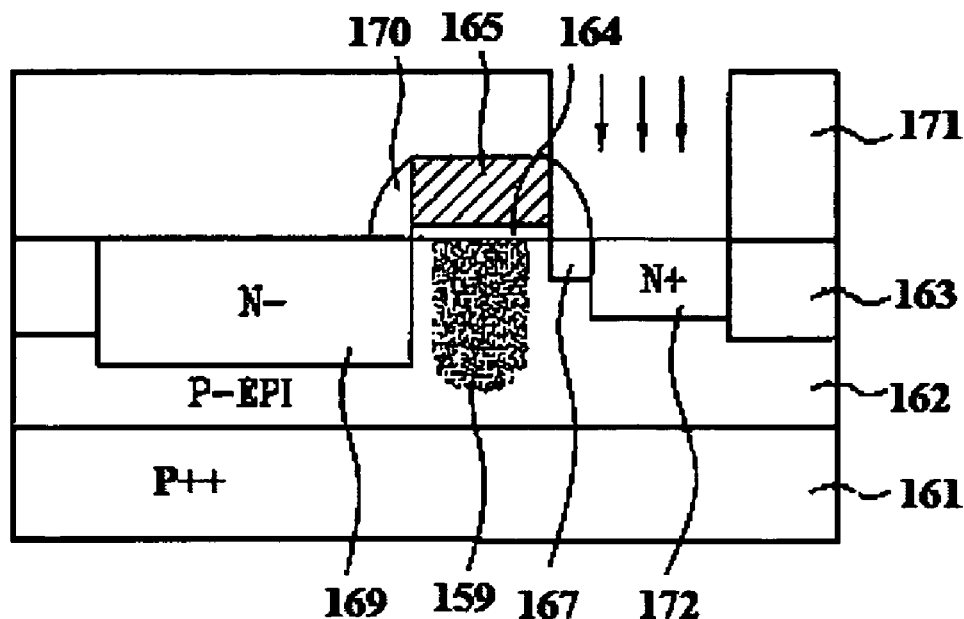

Referring to FIG. 7, after the third photoresistive layer 168 is removed, an insulating layer can be deposited on an entire surface of the semiconductor substrate 161, and insulating layer sidewalls 170 can be formed on both sides of the transfer gate electrode 165 by an etch-back process.

A fourth photoresistive layer 171 can be formed on an entire surface of the semiconductor substrate 161. The fourth photoresistive layer 171 can be patterned by an exposure process and a development process to cover the photodiode region and expose source/drain regions of the transfer transistor.

An N⁺-type floating diffusion region 172 can be formed by implanting N-type impurity ions into the exposed source/drain regions using the patterned fourth photoresistive layer 171 as a mask.

Figure 8:
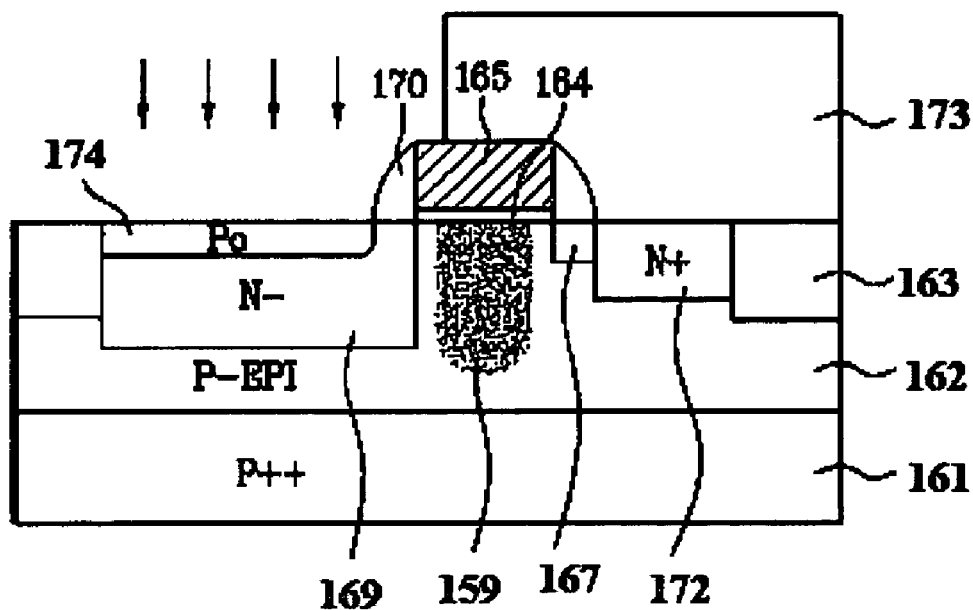

Referring to FIG. 8, after the fourth photoresistive layer 171 is removed, a fifth photoresistive layer 173 can be formed on an entire surface of the semiconductor substrate 161 and patterned by an exposure process and a development process to expose the photodiode regions.

A P°-type diffusion region 174 can be formed in a surface of the semiconductor substrate by implanting P°-type impurity ions into the photodiode region including the N⁻-type diffusion region 169 using the patterned fifth photoresistive layer 173 as a mask.

The CMOS image sensor and the method for fabricating the same according to embodiments of the present invention forms a P-type impurity region by increasing the P-type doping concentration below the gate electrode of the transfer transistor. Therefore, the present invention prevents the depletion area from being widely spread by the N⁻-type diffusion region 169 and can adjust the critical voltage of the transfer transistor.

Thus, the present invention can prevent the punch-through between the N⁻-type diffusion region 169 of the photodiode and the N⁺-type floating diffusion region 172 that is defined as the drain region of the transfer transistor. Also, the present invention can improve characteristics of the photodiode by decreasing an increase of dark current.

The CMOS image sensor and the method for fabricating the same according to the present invention have the following effect.

First, the present invention improves sensitivity of an image sensor by preventing electrons generated by light in the photodiode from leakage before turn-on of the transistor.

Second, the present invention improves a low light performance by preventing electrons generated by light from leakage before operation.

Third, the present invention can improve the characteristics of the photodiode by decreasing an increase of dark current generated before turn-on of the transistor.

Fourth, the present invention extends space for storing electrons at each region of the photodiode region and the floating diffusion region by increasing a capacity of the photodiode region and the floating diffusion region by a narrowed depletion area of the photodiode region and the floating diffusion region.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method of fabricating a CMOS image sensor, the method comprising:
    preparing a semiconductor substrate of a first conductivity type having a photodiode region and a transistor region defined therein;
    forming a first impurity region of the first conductivity type in a portion of the transistor region, wherein the first impurity region has a higher concentration of first conductivity type ions than the semiconductor substrate;
    forming a gate electrode above the first impurity region with a gate insulating layer interposed therebetween;
    forming a second impurity region of a second conductivity type at low concentration in the photodiode region;
    forming a first photoresistive layer on an entire surface of the semiconductor substrate including the gate electrode;
    patterning the first photoresistive layer to cover the photodiode region and expose source/drain regions of a transistor using an exposure process and a development process; and
    forming a diffusion region of the second conductivity type by implanting second conductivity type ions into the exposed source/drain regions at a low concentration using the patterned first photoresistive layer as a mask,
    wherein the first impurity region is formed deeper than the second impurity region,
    wherein forming the second impurity region comprises:
    forming a second photoresistive layer on an entire surface of the semiconductor substrate;
    patterning the second photoresistive layer to expose a portion of the photodiode region using an exposure process and a development process; and
    implanting second conductive type ions into the exposed portion of the photodiode region at a low concentration using the patterned second photoresistive layer as a mask.

2. The method according to claim 1, wherein the first impurity region is formed to have a width that is less than a CD (Critical Dimension) of the gate electrode.

3. The method according to claim 2, wherein the width of the first impurity region is less than the CD of the gate electrode and greater than or equal to about 0.15 μm, where the CD of the gate electrode is about 0.35 μm.

4. The method according to claim 1, wherein preparing a semiconductor substrate comprises forming a low concentration P-type epitaxial layer by performing an epitaxial process on the semiconductor substrate, wherein the first conductivity type is p-type.

5. The method according to claim 1, wherein forming a first impurity region comprises:
    forming a third photoresistive layer on an entire surface of the semiconductor substrate;
    patterning the third photoresistive layer to expose a predetermined portion of a gate electrode region; and
    implanting first conductive type impurity ions into the exposed predetermined portion of the gate electrode region using the patterned third photoresistive layer as a mask.

6. The method according to claim 1, wherein the first impurity region is formed to a predetermined depth that has no influence on a threshold voltage of a transistor.

7. The method according to claim 6, wherein the first impurity region is formed to a depth of about 0.15 μm to about 0.3 μm from the gate insulating layer.

8. The method according to claim 6, wherein the first impurity region is formed by implanting ions using implanting energy of 100~150 KeV.

9. The method according to claim 6, wherein the first impurity region is formed to a depth spaced about 0.15 μm to about 0.3 μm from the gate insulating layer by implanting ions using implanting energy of about 100 KeV to about 150 KeV.

10. The method according to claim 1, wherein the second impurity region is formed deeper into the substrate than the diffusion region by implanting the second conductive type ions into the exposed portion of the photodiode region using a higher ion implantation energy than implanting second conductivity type impurity ions into the exposed source/drain regions.

11. The method according to claim 1, further comprising:
    forming a fourth photoresistive layer on an entire surface of the semiconductor substrate;
    patterning the fourth photoresistive layer to cover the photodiode region and expose source/drain regions of the transistor using an exposure process and a development process; and
    forming a floating diffusion region of the second conductivity type by implanting the second conductivity type impurity ions at a high concentration into the exposed source/drain regions using the patterned fourth photoresistive layer as a mask.

12. The method according to claim 1, further comprising:
    forming a fifth photoresistive layer on an entire surface of the semiconductor substrate;
    patterning the fifth photoresistive layer to expose the photodiode region using an exposure process and a development process; and
    forming a $P^o$-type diffusion region in a surface of the semiconductor substrate by implanting $P^o$-type impurity ions into the photodiode region in which the second impurity region is formed using the patterned fifth photoresistive layer as a mask.

13. A method of fabricating a CMOS image sensor, the method comprising:
    preparing a semiconductor substrate of a first conductivity type having a photodiode region and a transistor region defined therein;
    forming a first impurity region of the first conductivity type in a portion of the transistor region, wherein the first impurity region has a higher concentration of first conductivity type ions than the semiconductor substrate;

forming a gate electrode above the first impurity region with a gate insulating layer interposed therebetween;

forming a second impurity region of a second conductivity type in the photodiode region, wherein the second impurity region in the photodiode region is formed at a source region of the gate electrode;

forming a first photoresistive layer on an entire surface of the semiconductor substrate including the gate electrode;

patterning the first photoresistive layer to cover the photodiode region and expose source/drain regions of a transistor using an exposure process and a development process; and forming a diffusion region of a second conductivity type by implanting second conductivity type ions into the exposed source/drain regions at a low concentration using the patterned first photoresistive layer as a mask.

14. The method according to claim 13, wherein the first impurity region is formed deeper than the second impurity region.

15. The method according to claim 13, wherein the first impurity region is formed only under the gate electrode.

16. The method according to claim 13, wherein the first impurity region is formed to have a width that is less than a CD (Critical Dimension) of the gate electrode.

17. The method according to claim 13, wherein forming the second impurity region comprises:

forming a second photoresistive layer on an entire surface of the semiconductor substrate;

patterning the second photoresistive layer to expose a portion of the photodiode region using an exposure process and a development process; and implanting second conductive type ions into the exposed portion of the photodiode region at a low concentration using the patterned second photoresistive layer as a mask.

18. The method according to claim 17, wherein the second impurity region is formed deeper into the substrate than the diffusion region by implanting the second conductive type ions into the exposed portion of the photodiode region using a higher ion implantation energy than implanting second conductivity type impurity ions into the exposed source/drain regions.

* * * * *

UNITED STATES PATENT AND TRADEMARK OFFICE
CERTIFICATE OF CORRECTION

PATENT NO. : 7,645,652 B2  Page 1 of 1
APPLICATION NO. : 11/507346
DATED : January 12, 2010
INVENTOR(S) : Keun Hyuk Lim It is certified that error appears in the above-identified patent and that said Letters Patent is hereby corrected as shown below:

On The Title Page, Inventor,
Item (12): "Hyuk" should read --Lim--.
Item (75): "Inventor: Lim Keun Hyuk" should read --Inventor: Keun Hyuk Lim--.

Signed and Sealed this

Twenty-third Day of February, 2010

David J. Kappos
*Director of the United States Patent and Trademark Office*